(12) United States Patent
Nishio

(10) Patent No.: US 12,439,508 B2
(45) Date of Patent: Oct. 7, 2025

(54) CIRCUIT BOARD

(71) Applicant: Murata Manufacturing Co., Ltd., Nagaokakyo (JP)

(72) Inventor: Kosuke Nishio, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 253 days.

(21) Appl. No.: 18/225,273

(22) Filed: Jul. 24, 2023

(65) Prior Publication Data

US 2024/0008168 A1    Jan. 4, 2024

Related U.S. Application Data

(63) Continuation of application No. PCT/JP2021/045751, filed on Dec. 13, 2021.

(30) Foreign Application Priority Data

Feb. 12, 2021 (JP) .................. 2021-020481

(51) Int. Cl.
*H05K 1/02* (2006.01)
*H01P 3/08* (2006.01)

(52) U.S. Cl.
CPC .......... *H05K 1/0242* (2013.01); *H01P 3/081* (2013.01); *H05K 1/028* (2013.01);
(Continued)

(58) Field of Classification Search
CPC .................................................. H05K 1/028
See application file for complete search history.

(56) References Cited

U.S. PATENT DOCUMENTS 5,629,654 A * 5/1997 Frick .............. H01P 5/186
333/116
2006/0192277 A1* 8/2006 RaghuRam ...... H01L 23/49816
257/E25.023
(Continued)

FOREIGN PATENT DOCUMENTS

JP    2008198651 A    8/2008
JP    2013153229 A    8/2013
(Continued)

OTHER PUBLICATIONS

International Search Report in PCT/JP2021/045751, mailed Feb. 1, 2022, 3 pages.
(Continued)

*Primary Examiner* — Timothy J Thompson
*Assistant Examiner* — John B Freal
(74) *Attorney, Agent, or Firm* — Keating & Bennett, LLP

(57) ABSTRACT

When viewed in an up-down direction, a first line-shaped reference conductor layer extends along a first signal conductor layer such that portions thereof overlap. When viewed in the up-down direction, the first line-shaped reference conductor layer meanders such that one or more first projecting portions projecting from the first signal conductor layer in a first orthogonal direction and one or more second projecting portions projecting from the first signal conductor layer in a second orthogonal direction alternate in a transmission direction. A section of at least one or more first pairs of projecting portions excluding both ends thereof is not connected to a conductor layer other than one or more of the one or more first projecting portions and one or more of the one or more second projecting portions included in the at least one or more first pairs of projecting portions.

20 Claims, 13 Drawing Sheets

(52) U.S. Cl.
CPC ............... *H05K 2201/0129* (2013.01); *H05K 2201/09263* (2013.01); *H05K 2201/09672* (2013.01); *H05K 2201/09681* (2013.01)

(56) References Cited

U.S. PATENT DOCUMENTS

| | | |
|---|---|---|
| 2012/0043117 A1 | 2/2012 | Kato et al. |
| 2012/0051005 A1* | 3/2012 | Vanfleteren ............. H01L 24/81 |
| | | 29/854 |
| 2012/0052268 A1* | 3/2012 | Axisa ................ H01L 23/49838 |
| | | 428/212 |
| 2012/0062447 A1* | 3/2012 | Tseng ................ G02F 1/133305 |
| | | 345/33 |
| 2012/0236579 A1* | 9/2012 | Uemura ............... H05K 1/0219 |
| | | 174/254 |
| 2012/0274423 A1 | 11/2012 | Kato |

FOREIGN PATENT DOCUMENTS

| | | |
|---|---|---|
| JP | 2014212355 A | 11/2014 |
| WO | 2010150588 A1 | 12/2010 |
| WO | 2012176453 A1 | 12/2012 |
| WO | 2015108094 A1 | 7/2015 |

OTHER PUBLICATIONS

Written Opinion in PCT/JP2021/045751, mailed Feb. 1, 2022, 5 pages.

\* cited by examiner

CIRCUIT BOARD

CROSS REFERENCE TO RELATED APPLICATIONS

This application claims the benefit of priority to Japanese Patent Application No. 2021-020481 filed on Feb. 12, 2021 and is a Continuation application of PCT Application No. PCT/JP2021/045751 filed on Dec. 13, 2021. The entire contents of each application are hereby incorporated herein by reference.

BACKGROUND OF THE INVENTION

1. Field of the Invention

The present invention relates to a circuit board including a signal conductor layer and a reference conductor layer.

2. Description of the Related Art

International Publication No. 2015/108094, for example, describes a signal line as an invention relating to a circuit board according to the related art. This signal line includes a body, a first ground conductor, a second ground conductor, and a signal line conductor. The body has a multilayer structure in which a plurality of flexible base material layers are laminated in an up-down direction. The first ground conductor, the second ground conductor, and the signal line conductor are provided in the body. The signal line conductor extends in a front-back direction. The first ground conductor is positioned above the signal line conductor. The second ground conductor is positioned below the signal line conductor.

The second ground conductor includes a first planar conductor, a second planar conductor, and connecting conductors. When viewed in the up-down direction, the signal line conductor overlaps the first planar conductor and the second planar conductor. When viewed in the up-down direction, the connecting conductors are positioned between the first planar conductor and the second planar conductor. The connecting conductors connect the first planar conductor and the second planar conductor to each other. When viewed in the up-down direction, the connecting conductors do not overlap the signal line conductor. The connecting conductors have a meandering shape.

The above-described circuit board is bent in a section in which the connecting conductors are provided. Since the connecting conductors have a meandering shape, the connecting conductors can be easily expanded and contracted in a front-back direction. Therefore, when the circuit board is bent, the possibility of breakage of the connecting conductors is reduced.

SUMMARY OF THE INVENTION

In the circuit board according to International Publication No. 2015/108094, radiation may occur. More specifically, in sections of the circuit board in which the first planar conductor and the second planar conductor are provided, the signal line conductor forms a strip-line structure. Accordingly, the sections in which the first planar conductor and the second planar conductor are provided are referred to as strip-line sections. In a section in which the connecting conductors are provided, the signal line conductor forms a micro-strip-line structure. Accordingly, the section in which the connecting conductors are provided is referred to as a micro-strip-line section.

A propagation mode in the strip-line sections differs from a propagation mode in the micro-strip-line section. When the propagation mode in the strip-line sections differs from the propagation mode in the micro-strip-line section, reflection of a high-frequency signal occurs at the boundaries between the strip-line sections and the micro-strip-line section.

The micro-strip-line section is sufficiently long so that the circuit board can be bent. Therefore, the length of the micro-strip-line section may, for example, be close to an integer multiple of ¼ of a wavelength of a high-frequency signal transmitted through the signal line conductor. In this case, the high-frequency signal transmitted through the signal line conductor is reflected at the boundaries between the strip-line sections and the micro-strip-line section. Accordingly, a standing wave of the high-frequency signal transmitted through the signal line conductor may be generated in the signal line conductor. As a result, radiation may be emitted from the signal line conductor.

Accordingly, preferred embodiments of the present invention provide circuit boards that each can be easily bent and in which radiation can be reduced.

A circuit board according to an aspect of a preferred embodiment of the present invention includes a body including an upper principal surface and a lower principal surface, the upper principal surface having a normal extending in an up-down direction, a first signal conductor layer that is line-shaped and provided in the body, and a first line-shaped reference conductor layer that is line-shaped and provided in the body at a position above the first signal conductor layer. A direction in which the first signal conductor layer extends is defined as a transmission direction. A direction orthogonal to the up-down direction and the transmission direction is defined as an orthogonal direction. The orthogonal direction includes a first orthogonal direction and a second orthogonal direction opposite to the first orthogonal direction. When viewed in the up-down direction, the first line-shaped reference conductor layer extends along the first signal conductor layer such that portions of the first line-shaped reference conductor layer and portions of the first signal conductor layer overlap. When viewed in the up-down direction, the first line-shaped reference conductor layer meanders such that one or more first projecting portions projecting from the first signal conductor layer in the first orthogonal direction and one or more second projecting portions projecting from the first signal conductor layer in the second orthogonal direction are arranged in an alternating order in the transmission direction. A pair including one of the one or more first projecting portions and one of the one or more second projecting portions that are adjacent to each other is defined as a first pair of projecting portions. A section of at least one or more first pairs of projecting portions excluding both ends of the at least one or more first pairs of projecting portions is not connected to a conductor layer other than one or more of the one or more first projecting portions and one or more of the one or more second projecting portions included in the at least one or more first pairs of projecting portions.

According to the circuit boards of preferred embodiments of the present invention, the circuit boards can be easily bent, and radiation can be reduced.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred Embodiments

Structure of Circuit Board 10

Figure 1:
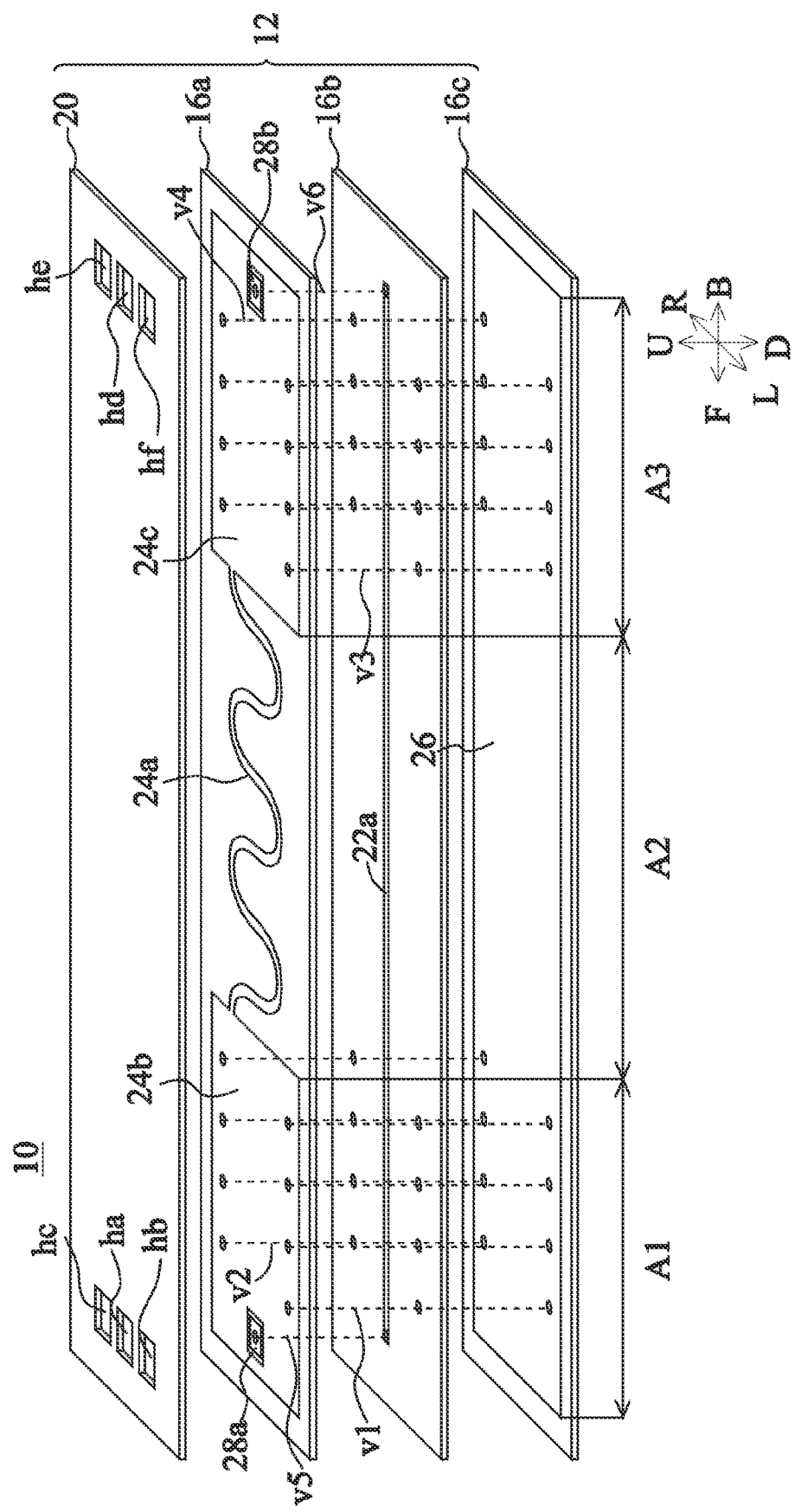
FIG. 1 is an exploded perspective view of a circuit board 10.
Figure 2:
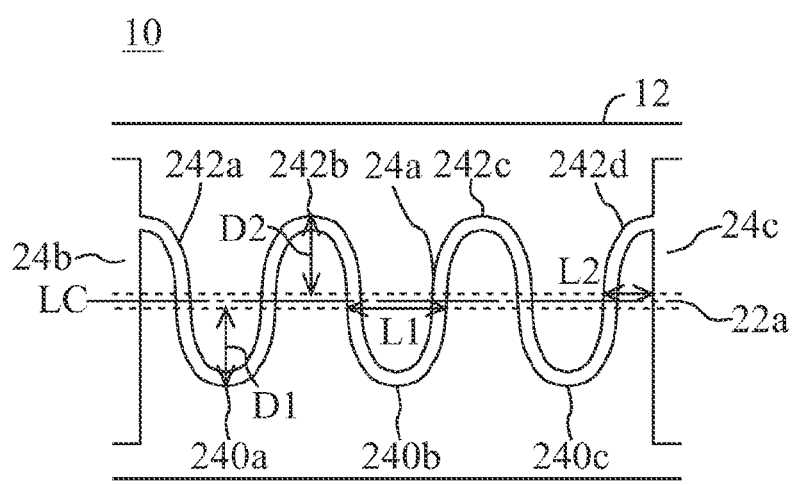
FIG. 2 is a top view of a central portion of the circuit board 10 in a front-back direction.

The structure of a circuit board 10 according to a preferred embodiment of the present invention will now be described with reference to the drawings. FIG. 1 is an exploded perspective view of the circuit board 10. FIG. 2 is a top view of a central portion of the circuit board 10 in a front-back direction. FIG. 2 illustrates a see-through view of the circuit board 10.

In this specification, directions are defined as follows. A direction in which layers of a body 12 of the circuit board 10 are laminated is defined as an up-down direction. A direction in which a first signal conductor layer 22a of the circuit board 10 extends is defined as a front-back direction (transmission direction). A direction orthogonal to the up-down direction and the front-back direction (transmission direction) is defined as a left-right direction (orthogonal direction). The left-right direction is a line-width direction of the first signal conductor layer 22a. The left-right direction (orthogonal direction) includes a leftward direction (first orthogonal direction) and a rightward direction (second orthogonal direction) opposite to the leftward direction (first orthogonal direction). The up-down direction, the front-back direction, and the left-right direction are orthogonal to each other. It is not necessary that the up-down direction, the front-back direction, and the left-right direction in this specification be the same as an up-down direction, a front-back direction, and a left-right direction of the circuit board 10 when the circuit board 10 is used.

In the following description, assume that X and Y are components or members of the circuit board 10. In this specification, "X and Y are electrically connected" means that electricity flows between X and Y. Therefore, X and Y may be in contact with each other, but are not necessarily in contact with each other. When X and Y are not in contact with each other, Z, which is conductive, is disposed between X and Y. In this specification, "X and Y are connected" means that X and Y are connected such that X and Y are in contact with each other.

In this specification, portions of X are defined as follows unless otherwise specified. A front portion of X means the front half of X. A back portion of X means the back half of X. A left portion of X means the left half of X. A right portion of X means the right half of X. An upper portion of X means the upper half of X. A lower portion of X means the lower half of X. A front end of X means the end of X in the forward direction. A back end of X means the end of X in the backward direction. A left end of X means the end of X in the leftward direction. A right end of X means the end of X in the rightward direction. An upper end of X means the end of X in the upward direction. A lower end of X means the end of X in the downward direction. A front end portion of X means a portion at and near the front end of X. A back end portion of X means a portion at and near the back end of X. A left end portion of X means a portion at and near the left end of X. A right end portion of X means a portion at and near the right end of X. An upper end portion of X means a portion at and near the upper end of X. A lower end portion of X means a portion at and near the lower end of X.

The structure of the circuit board 10 will now be described with reference to FIG. 1. The circuit board 10 transmits a high-frequency signal. The high-frequency signal is, for example, a signal with a frequency of 1 GHz or more. The circuit board 10 is used to electrically connected two circuits in an electronic device, such as a smartphone. As illustrated in FIG. 1, the circuit board 10 has a strip shape that extends in the front-back direction.

As illustrated in FIG. 1, the circuit board 10 includes a body 12, a first signal conductor layer 22a, a first line-shaped reference conductor layer 24a, first reference conductor layers 24b and 24c, a second reference conductor layer 26, signal electrodes 28a and 28b, a plurality of interlayer connection conductors v1, a plurality of interlayer connection conductors v2, a plurality of interlayer connection conductors v3, a plurality of interlayer connection conductors v4, and interlayer connection conductors v5 and v6. In FIG. 1, only representative ones of the interlayer connection conductors v1, the interlayer connection conductors v2, the interlayer connection conductors v3, and the interlayer connection conductors v4 are denoted by reference signs v1 to v4.

The body 12 is plate-shaped. Therefore, the body 12 includes an upper principal surface and a lower principal surface. The upper and lower principal surfaces of the body 12 have normals extending in the up-down direction. The upper and lower principal surfaces of the body 12 have a strip-shape extending in the front-back direction. Therefore, the length of the body 12 in the front-back direction is greater than the length of the body 12 in the left-right direction.

As illustrated in FIG. 1, the body 12 includes insulator layers 16a to 16c and a protective layer 20. The body 12 has a multilayer structure in which the insulator layers 16a to 16c and the protective layer 20 are laminated in the up-down direction. The protective layer 20 and the insulator layers 16a to 16c are arranged in that order in the downward direction. The insulator layers 16a to 16c have the same shape as the strip shape of the body 12 when viewed in the up-down direction. The insulator layers 16a to 16c are flexible dielectric sheets. The material of the insulator layers 16a to 16c (body 12) includes a thermoplastic resin. The thermoplastic resin may be, for example, a liquid crystal polymer or polytetrafluoroethylene (PTFE). The material of the insulator layers 16a to 16c may be polyimide. Accordingly, the body 12 is flexible. The protective layer 20 will be described in detail below.

The first signal conductor layer 22a is provided in the body 12. In the present preferred embodiment, the first signal conductor layer 22a is provided on an upper principal surface of the insulator layer 16b. The first signal conductor layer 22a is line-shaped. The first signal conductor layer 22a extends in the front-back direction.

The first line-shaped reference conductor layer 24a is provided in the body 12 at a position above the first signal conductor layer 22a. In the present preferred embodiment, the first line-shaped reference conductor layer 24a is provided on an upper principal surface of the insulator layer 16a. The first line-shaped reference conductor layer 24a is line-shaped. The first line-shaped reference conductor layer 24a extends in the front-back direction and meanders. In the present preferred embodiment, the first line-shaped reference conductor layer 24a has the shape of a sine wave. More specifically, as illustrated in FIG. 2, when viewed in the up-down direction, the first line-shaped reference conductor layer 24a has the shape of a line extending along the first signal conductor layer 22a such that portions of the first line-shaped reference conductor layer 24a and portions of the first signal conductor layer 22a overlap. The first line-shaped reference conductor layer 24a includes first projecting portions 240a, 240b, and 240c and second projecting portions 242a, 242b, 242c, and 242d. When viewed in the up-down direction, the first line-shaped reference conductor layer 24a meanders such that the first projecting portions 240a, 240b, and 240c, which project leftward (in the first orthogonal direction) from the first signal conductor layer 22a, and the second projecting portions 242a, 242b, 242c, and 242d, which project rightward (in the second orthogonal direction) from the first signal conductor layer 22a, are arranged in an alternating order in the front-back direction (transmission direction). Accordingly, when viewed in the up-down direction, the first line-shaped reference conductor layer 24a crosses the first signal conductor layer 22a a plurality of times. In the present preferred embodiment, the first line-shaped reference conductor layer 24a crosses the first signal conductor layer 22a six times.

The first projecting portions 240a to 240c and the second projecting portions 242a to 242d will now be described. As illustrated in FIG. 2, the second projecting portion 242a, the first projecting portion 240a, the second projecting portion 242b, the first projecting portion 240b, the second projecting portion 242c, the first projecting portion 240c, and the second projecting portion 242d are arranged in that order from front to back in the front-back direction. A length L2 of the second projecting portions 242a and 242d in the front-back direction is about ¼ of the wavelength of the sine wave, for example. A length L1 of the first projecting portions 240a to 240c and the second projecting portions 242b and 242c in the front-back direction is about ½ of the wavelength of the sine wave, for example. An amount of projection D1 of the first projecting portions 240a to 240c from the first signal conductor layer 22a in the left-right direction (orthogonal direction) is substantially equal to an amount of projection D2 of the second projecting portions 242a to 242d from the first signal conductor layer 22a in the left-right direction (orthogonal direction). Therefore, when viewed in the up-down direction, the first signal conductor layer 22a overlaps a center LC of the first line-shaped reference conductor layer 24a in the left-right direction. Here, "substantially equal" means that the amounts are precisely equal or have a difference comparable to manufacturing errors.

The length L1 of the first projecting portions 240a to 240c in the front-back direction (transmission direction) and the length L1 of the second projecting portions 242b and 242c in the front-back direction (transmission direction) are less than or equal to about ¼ of a wavelength of a high-frequency signal transmitted through the first signal conductor layer 22a, for example. The length of the second projecting portions 242a and 242d in the front-back direction (transmission direction) is less than or equal to about ⅛ of the wavelength of the high-frequency signal transmitted through the first signal conductor layer 22a, for example.

Figure 3:
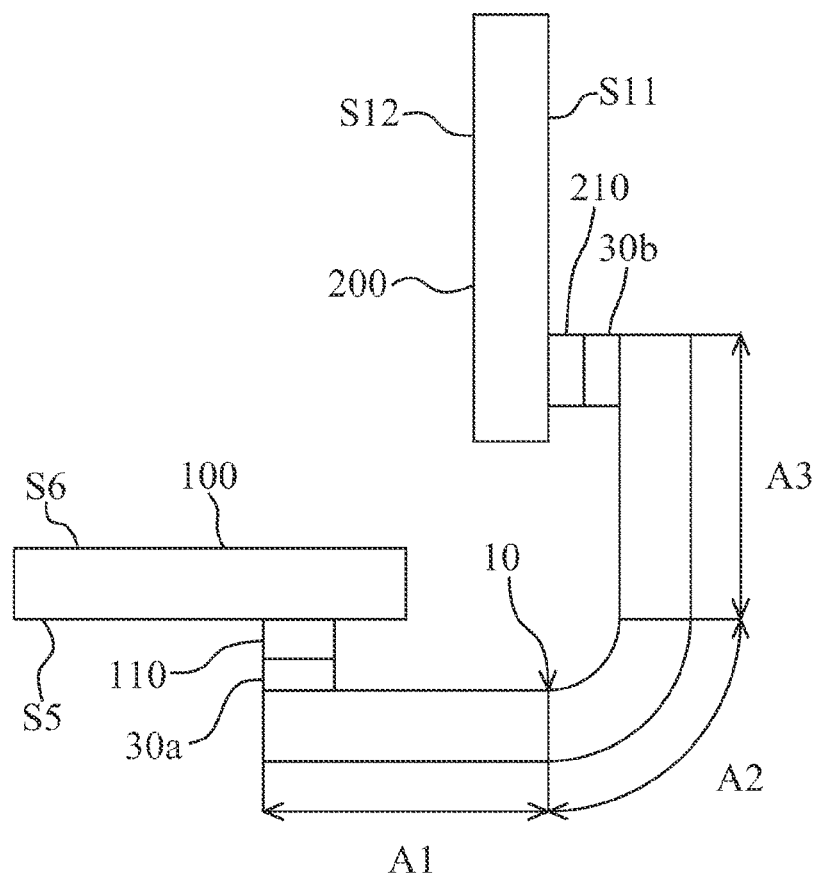
FIG. 3 is a left side view of a portion of the internal structure of an electronic device 1 including the circuit board 10.

The first line-shaped reference conductor layer 24a is not connected to another conductor layer over a length corresponding to the wavelength of the sine wave formed by the first line-shaped reference conductor layer 24a. More specifically, assume that a pair including one of the first projecting portions and one of the second projecting portions that are adjacent to each other is defined as a first pair of projecting portions. In this case, a section of at least one or more first pairs of projecting portions excluding both ends of the at least one or more first pairs of projecting portions is not connected to a conductor layer other than one or more of the first projecting portions and one or more of the second projecting portions included in the at least one or more first pairs of projecting portions. In the present preferred embodiment, the front end of the first line-shaped reference conductor layer 24a is connected to the first reference conductor layer 24b described below. The back end of the first line-shaped reference conductor layer 24a is connected to the first reference conductor layer 24c described below. Therefore, a section including the first projecting portions 240a to 240c and the second projecting portions 242b and 242c and excluding the front end of the first projecting portion 240a and the back end of the first projecting portion 240c is not connected to a conductor layer other than the first projecting portions 240a to 240c and the second projecting portions 242b and 242c. Accordingly, the first line-shaped reference conductor layer 24a is not connected to a conductor layer other than the first line-shaped reference conductor layer 24a over a length corresponding to at least twice the wavelength of the sine wave formed by the first line-shaped reference conductor layer 24a. Namely, the first line-shaped reference conductor layer 24a does not have a branching structure. In other words, the first line-shaped reference conductor layer 24a does not include a connecting conductor having a shape obtained by combining two sine-wave-shaped conductor layers with phases differing by 180° as illustrated in FIG. 3 of International Publication No. 2015/108094.

As illustrated in FIG. 1, the first reference conductor layer 24b is provided in the body 12 at a position above the first signal conductor layer 22a. In the present preferred embodiment, the first reference conductor layer 24b is provided on the upper principal surface of the insulator layer 16a. The first reference conductor layer 24b is connected to an end of the first line-shaped reference conductor layer 24a. In the present preferred embodiment, the first reference conductor layer 24b is connected to the front end of the first line-shaped reference conductor layer 24a. The first reference conductor layer 24b has a rectangular or substantially rectangular shape when viewed in the up-down direction. When viewed in the up-down direction, the ratio of the area of the first reference conductor layer 24b that occupies the area of a unit length of the body 12 in the front-back direction is greater than the ratio of the area of the first line-shaped reference conductor layer 24a that occupies the area of a unit length of the body 12 in the front-back direction. In addition, the width of the first reference conductor layer 24b in the left-right direction (orthogonal direction) is greater than or equal to the width of the first line-shaped reference conductor layer 24a in the left-right direction (orthogonal direction). In other words, the width of the first reference conductor layer 24b in the left-right direction is greater than or equal to the distance from the left ends of the first projecting portions 240a to 240c to the right ends of the second projecting portions 242a to 242d in the left-right direction. In other words, the width of the first reference conductor layer 24b in the left-right direction is greater than or equal to the amplitude of the first line-shaped reference conductor layer 24a. Since the first reference conductor layer 24b has a large width in the left-right direction, the first reference conductor layer 24b overlaps the first signal conductor layer 22a when viewed in the up-down direction. A section in which the first signal conductor layer 22a overlaps the first reference conductor layer 24b is a single continuous section. The first reference conductor layer 24b described above is connected to a reference potential. The reference potential is, for example, a ground potential. The first reference conductor layer 24c has a structure symmetrical to that of the first reference conductor layer 24b in the front-back direction. Therefore, description of the first reference conductor layer 24c is omitted.

As illustrated in FIG. 1, the second reference conductor layer 26 is provided in the body 12 at a position below the first signal conductor layer 22a. In the present preferred embodiment, the second reference conductor layer 26 is provided on an upper principal surface of the insulator layer 16c. The second reference conductor layer 26 covers a large portion of the insulator layer 16c. Therefore, when viewed in the up-down direction, the second reference conductor layer 26 overlaps the entirety of the first signal conductor layer 22a. The second reference conductor layer 26 described above is connected to a reference potential. The reference potential is, for example, a ground potential. Thus, the first signal conductor layer 22a, the first reference conductor layers 24b and 24c, and the second reference conductor layer 26 form a strip-line structure.

As illustrated in FIG. 1, the interlayer connection conductors v1 and the interlayer connection conductors v2 electrically connected the first reference conductor layer 24b and the second reference conductor layer 26 to each other. More specifically, the interlayer connection conductors v1 and the interlayer connection conductors v2 extend through the insulator layers 16a and 16b in the up-down direction. The upper ends of the interlayer connection conductors v1 and the upper ends of the interlayer connection conductors v2 are connected to the first reference conductor layer 24b. The lower ends of the interlayer connection conductors v1 and the lower ends of the interlayer connection conductors v2 are connected to the second reference conductor layer 26. The interlayer connection conductors v1 are disposed to the left of the first signal conductor layer 22a. In this specification, the arrangement in which the interlayer connection conductors v1 are disposed to the left of the first signal conductor layer 22a has the following meaning. That is, at least portions of the interlayer connection conductors v1 are disposed in a region through which the first signal conductor layer 22a passes when the first signal conductor layer 22a is translated leftward. Therefore, the interlayer connection conductors v1 may be disposed within the region through which the first signal conductor layer 22a passes when the first signal conductor layer 22a is translated leftward, or project from the region through which the first signal conductor layer 22a passes when the first signal conductor layer 22a is translated leftward. The interlayer connection conductors v1 are aligned in the front-back direction with equal intervals therebetween. The interlayer connection conductors v2 are disposed to right of the first signal conductor layer 22a. The interlayer connection conductors v2 are aligned in the front-back direction with equal intervals therebetween. The interlayer connection conductors v3 and the interlayer connection conductors v4 have structures symmetrical to those of and the interlayer connection conductors v1 and the interlayer connection conductors v2 in the front-back direction. Therefore, description of the interlayer connection conductors v3 and the interlayer connection conductors v4 is omitted.

As illustrated in FIG. 1, the signal electrode 28a is provided on the upper principal surface of the insulator layer 16a. More specifically, the signal electrode 28a is disposed on a front end portion of the upper principal surface of the insulator layer 16a. When viewed in the up-down direction, the signal electrode 28a has a rectangular or substantially rectangular shape. When viewed in the up-down direction, the signal electrode 28a overlaps a front end portion of the first signal conductor layer 22a. The first reference conductor layer 24b is not in contact with the signal electrode 28a so that short-circuiting between the signal electrode 28a and the first reference conductor layer 24b does not occur. The signal electrode 28b has a structure symmetrical to that of the signal electrode 28a in the front-back direction.

Therefore, description of the signal electrode 28b is omitted.

As illustrated in FIG. 1, the interlayer connection conductor v5 electrically connects the first signal conductor layer 22a and the signal electrode 28a to each other. The interlayer connection conductor v5 extends through the insulator layer 16a in the up-down direction. The upper end of the interlayer connection conductor v5 is connected to the signal electrode 28a. The lower end of the interlayer connection conductor v5 is connected to the front end portion of the first signal conductor layer 22a. The interlayer connection conductor v6 has a structure symmetrical to that of the interlayer connection conductor v5 in the front-back direction. Therefore, description of the interlayer connection conductor v6 is omitted.

The protective layer 20 is an insulator layer. However, the material of the protective layer 20 differs from the material of the insulator layers 16a to 16c. The protective layer 20 is a resist layer. Therefore, the protective layer 20 may be formed by placing a resin sheet on the upper principal surface of the insulator layer 16a or by applying liquid resin to the upper principal surface of the insulator layer 16a. As illustrated in FIG. 1, the protective layer 20 covers the first line-shaped reference conductor layer 24a and the first reference conductor layers 24b and 24c. The protective layer 20 includes cavities ha to hf. The cavity ha overlaps the signal electrode 28a when viewed in the up-down direction. Accordingly, the signal electrode 28a is exposed to the outside of the circuit board 10 at the cavity ha. The cavity hb is disposed to the left of the cavity ha. The cavity hc is disposed to the right of the cavity ha. Accordingly, the first reference conductor layer 24b is exposed to the outside of the circuit board 10 at the cavities hb and hc. The cavities hd to hf have structures symmetrical to those of the cavities ha to hc in the front-back direction. Therefore, description of the cavities hd to hf is omitted.

The first signal conductor layer 22a, the first line-shaped reference conductor layer 24a, the first reference conductor layers 24b and 24c, the second reference conductor layer 26, and the signal electrodes 28a and 28b are formed by patterning of metal foils provided on the upper principal surfaces of the insulator layers 16a to 16c. The metal foils are, for example, copper foils. The interlayer connection conductors v1 to v6 are formed by forming through holes in the insulator layers 16a and 16b, filling the through holes with conductive paste, and solidifying the conductive paste by applying heat.

Structure of Electronic Device 1

The structure of an electronic device 1 including the circuit board 10 will now be described with reference to the drawings.

FIG. 3 is a left side view of a portion of the internal structure of the electronic device 1 including the circuit board 10. The electronic device 1 is, for example, a portable wireless communication terminal. The electronic device 1 is, for example, a smartphone.

As illustrated in FIG. 3, the circuit board 10 is bent. Here, "circuit board 10 is bent" means that the circuit board 10 is deformed and bent as a result of an external force applied thereto. There are two modes in which the "circuit board 10 is bent". More specifically, in a first mode in which the "circuit board 10 is bent", the circuit board 10 is bent by plastic deformation. The circuit board 10 is easily plastically deformed when the circuit board 10 is bent while being heated. In this case, the material of the insulator layers 16a to 16c is a thermoplastic resin. In a second mode in which the "circuit board 10 is bent", the circuit board 10 is bent by elastic deformation.

In the following description, a section in which the circuit board 10 is bent is referred to as a bent section A2. Sections in which the circuit board 10 is not bent are referred to as non-bent sections A1 and A3. An x-axis, a y-axis, and a z-axis of the electronic device 1 are defined as follows. The x-axis extends in the front-back direction in the non-bent section A1. The y-axis extends in the left-right direction in the non-bent section A1. The z-axis extends in the up-down direction in the non-bent section A1. The bent section A2 is positioned between the non-bent section A1 and the non-bent section A3.

As illustrated in FIG. 3, the circuit board 10 includes the bent section A2 and the non-bent sections A1 and A3. The circuit board 10 is flat in the non-bent sections A1 and A3. In other words, the non-bent sections A1 and A3 are not bent. The bent section A2 is bent in the z-axis direction (up-down direction in the non-bent section) relative to the non-bent section A1. In the present preferred embodiment, the bent section A2 is bent in the positive z-axis direction (upward direction in the non-bent section) relative to the non-bent section A1. Therefore, as illustrated in FIG. 3, the up-down direction and the front-back direction differ depending on the position on the circuit board 10. In the non-bent section A1 in which the circuit board 10 is not bent, the up-down direction and the front-back direction are the same as the z-axis direction and the x-axis direction, respectively. In the bent section A2 in which the circuit board 10 is bent, the up-down direction and the front-back direction are not the same as the z-axis direction and the x-axis direction, respectively.

As illustrated in FIG. 1, at least a portion of the first line-shaped reference conductor layer 24a is positioned in the bent section A2. In the present preferred embodiment, the entirety of the first line-shaped reference conductor layer 24a is positioned in the bent section A2.

As illustrated in FIG. 3, the electronic device 1 includes the circuit board 10, connectors 30a, 30b, 110, and 210, and circuit boards 100 and 200.

The circuit boards 100 and 200 are plate-shaped. The circuit board 100 includes principal surfaces S5 and S6. The principal surface S5 is positioned in the negative z-axis direction from the principal surface S6. The circuit board 200 includes principal surfaces S11 and S12. The principal surface S11 is positioned in the positive x-axis direction from the principal surface S12. The circuit boards 100 and 200 include wiring conductor layers, reference conductor layers, and electrodes (not illustrated).

The connectors 30a and 30b are mounted on the upper principal surface of the body 12 in the non-bent section A1 and the non-bent section A3, respectively. More specifically, the connector 30a is mounted on the signal electrode 28a and the first reference conductor layer 24b exposed at the cavities ha to hc. The connector 30b is mounted on the signal electrode 28b and the first reference conductor layer 24c exposed at the cavities hd to hf. The connectors 30a and 30b are mounted by using a conductive joining material, such as solder or conductive adhesive.

The connectors 110 and 210 are respectively mounted on the principal surface S5 of the circuit board 100 and the principal surface S11 of the circuit board 200. The connectors 110 and 210 are respectively connected to the connectors 30a and 30b. Thus, the circuit board 10 electrically connects the circuit board 100 and the circuit board 200 to each other.

Effects

According to the circuit board 10, the circuit board 10 can be easily bent. More specifically, when the bent section A2 is bent in the positive z-axis direction relative to the non-bent section A1, the first line-shaped reference conductor layer 24a is contracted in the front-back direction. When the bent section A2 is bent in the negative z-axis direction relative to the non-bent section A1, the first line-shaped reference conductor layer 24a is expanded in the front-back direction. Therefore, when the first line-shaped reference conductor layer 24a has a structure that can be easily expanded and contracted, the circuit board 10 can be easily bent. Accordingly, in the circuit board 10, the first line-shaped reference conductor layer 24a has a shape of a meandering line. Since the first line-shaped reference conductor layer 24a is line-shaped, the first line-shaped reference conductor layer 24a has a small spring constant in the front-back direction. In other words, the first line-shaped reference conductor layer 24a can be easily expanded and contracted. In addition, since the first line-shaped reference conductor layer 24a meanders, the first line-shaped reference conductor layer 24a is long. Therefore, the spring constant of the first line-shaped reference conductor layer 24a in the front-back direction is further reduced. The first line-shaped reference conductor layer 24a can be more easily expanded and contracted. As a result, according to the circuit board 10, the circuit board 10 can be easily bent.

According to the circuit board 10, radiation can be reduced. More specifically, in the circuit board 10, when viewed in the up-down direction, the first line-shaped reference conductor layer 24a meanders such that the first projecting portions 240a to 240c, which project leftward from the first signal conductor layer 22a, and the second projecting portions 242a to 242d, which project rightward from the first signal conductor layer 22a, are arranged in an alternating order in the front-back direction. Accordingly, when viewed in the up-down direction, the first line-shaped reference conductor layer 24a crosses the first signal conductor layer 22a a plurality of times. A transmission mode in regions in which the first signal conductor layer 22a overlaps the first line-shaped reference conductor layer 24a (hereinafter referred to as overlapping regions) differs from a transmission mode in regions in which the first signal conductor layer 22a does not overlap the first line-shaped reference conductor layer 24a (hereinafter referred to as non-overlapping regions). Therefore, reflection of a high-frequency signal easily occurs at boundaries between the overlapping regions and the non-overlapping regions.

However, in the circuit board 10, the length corresponding to the wavelength of the sine wave formed by the first line-shaped reference conductor layer 24a can be easily adjusted. Therefore, the intervals between the overlapping regions that are adjacent to each other can be designed to be sufficiently small relative to the wavelength of the high-frequency signal transmitted through the first signal conductor layer 22a. As a result, the frequency of standing waves that may be generated between the adjacent overlapping regions of the first signal conductor layer 22a is sufficiently higher than the frequency of the high-frequency signal transmitted through the first signal conductor layer 22a. As a result, generation of standing waves in the regions between the adjacent overlapping regions of the first signal conductor layer 22a due to the high-frequency signal transmitted through the first signal conductor layer 22a is reduced or prevented. As a result, according to the circuit board 10, radiation can be reduced. In particular, in the circuit board 10, the length of the first projecting portions 240a to 240c in the front-back direction and the length of the second projecting portions 242b and 242c in the front-back direction is less than or equal to about ¼ of the wavelength of the high-frequency signal transmitted through the first signal conductor layer 22a, for example. Therefore, the distance between the adjacent overlapping regions is less than or equal to about ¼ of the wavelength of the high-frequency signal transmitted through the first signal conductor layer 22a, for example. As a result, generation of standing waves in the regions between the adjacent overlapping regions of the first signal conductor layer 22a due to the high-frequency signal transmitted through the first signal conductor layer 22a is further reduced or prevented. Thus, according to the circuit board 10, radiation can be reduced.

According to the circuit board 10, the width of the first line-shaped reference conductor layer 24a in the left-right direction can be reduced. More specifically, the amount of projection D1 of the first projecting portions 240a to 240c from the first signal conductor layer 22a in the left-right direction is substantially equal to the amount of projection D2 of the second projecting portions 242a to 242d from the first signal conductor layer 22a in the left-right direction. Therefore, when viewed in the up-down direction, the first signal conductor layer 22a overlaps the center CL of the first line-shaped reference conductor layer 24a in the left-right direction. Accordingly, when viewed in the up-down direction, the first signal conductor layer 22a does not easily protrude from the first line-shaped reference conductor layer 24a in the left-right direction. As a result, according to the circuit board 10, the width of the first line-shaped reference conductor layer 24a in the left-right direction can be reduced.

According to the circuit board 10, the characteristic impedance of the first signal conductor layer 22a does not easily vary from the desired characteristic impedance (for example, about 100Ω) due to displacements between the layers of the body 12. More specifically, the amount of projection D1 of the first projecting portions 240a to 240c from the first signal conductor layer 22a in the left-right direction is substantially equal to the amount of projection D2 of the second projecting portions 242a to 242d from the first signal conductor layer 22a in the left-right direction. Therefore, when viewed in the up-down direction, the first signal conductor layer 22a overlaps the center CL of the first line-shaped reference conductor layer 24a in the left-right direction. Accordingly, when viewed in the up-down direction, the first signal conductor layer 22a does not easily protrude from the first line-shaped reference conductor layer 24a in the left-right direction even if the layers of the body 12 are displaced from each other. As a result, the capacitance between the first signal conductor layer 22a and the first line-shaped reference conductor layer 24a does not easily vary from the design value. Thus, according to the circuit board 10, the characteristic impedance of the first signal conductor layer 22a does not easily vary from the desired characteristic impedance (for example, about 100Ω) due to displacements between the layers of the body 12.

First Modification

Figure 4:
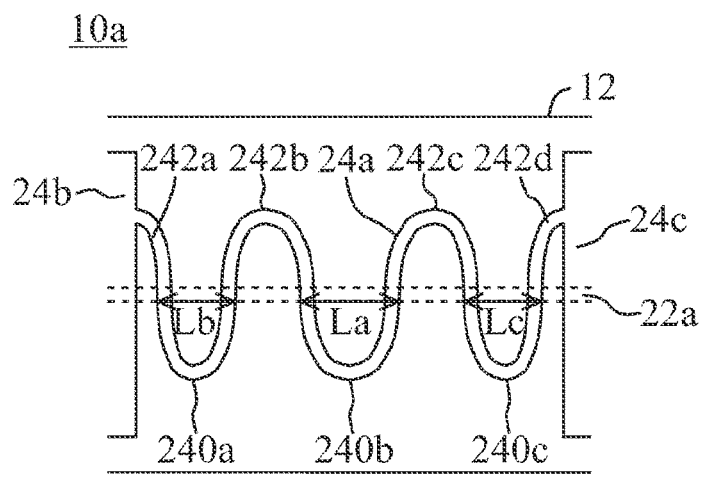
FIG. 4 is a top view of a central portion of a circuit board 10a in the front-back direction.

A circuit board 10a according to a first modification will now be described with reference to the drawings. FIG. 4 is a top view of a central portion of the circuit board 10a in the front-back direction.

In the circuit board 10, the wavelength of the sine wave formed by the first line-shaped reference conductor layer 24a is constant. In the circuit board 10a, the wavelength of the sine wave formed by the first line-shaped reference conductor layer 24a is not constant. More specifically, the wavelength of the sine wave is longer in the central region of the first line-shaped reference conductor layer 24a in the front-back direction than in regions near the front and rear ends of the first line-shaped reference conductor layer 24a in the front-back direction. Accordingly, a length La in the front-back direction (transmission direction) of the first projecting portion 240b closest to the center of the first signal conductor layer 22a in the front-back direction (transmission direction) is greater than a length Lb, Lc in the front-back direction (transmission direction) of the first projecting portions 240a and 240c closest to the ends of the first signal conductor layer 22a in the front-back direction (transmission direction). The length La of the first projecting portion 240b in the front-back direction is the longest of the lengths of the first projecting portions 240a to 240c in the front-back direction. The length La of the first projecting portion 240b in the front-back direction is less than about ¼ of the wavelength of the high-frequency signal transmitted through the first signal conductor layer 22a, for example. In the above-described circuit board 10a, as illustrated in FIG. 3, the bent section A2 is bent in the positive z-axis direction (upward direction in the non-bent section) relative to the non-bent section A1. Other structures of the circuit board 10a are the same as those of the circuit board 10, and description thereof is thus omitted.

The circuit board 10a provides effects similar to those of the circuit board 10. In addition, according to the circuit board 10a, variation in the characteristic impedance of the first signal conductor layer 22a from the desired characteristic impedance is reduced. More specifically, in the circuit board 10a, as illustrated in FIG. 3, the bent section A2 is bent in the positive z-axis direction relative to the non-bent section A1. In this case, the central region of the first line-shaped reference conductor layer 24a in the front-back direction is contracted in the front-back direction to a greater extent than the regions near the front and rear ends of the first line-shaped reference conductor layer 24a. Accordingly, the length La in the front-back direction (transmission direction) of the first projecting portion 240b closest to the center of the first signal conductor layer 22a in the front-back direction (transmission direction) is greater than the length Lb, Lc in the front-back direction (transmission direction) of the first projecting portions 240a and 240c closest to the ends of the first signal conductor layer 22a in the front-back direction (transmission direction). Accordingly, when the bent section A2 is bent in the positive z-axis direction relative to the non-bent section A1, the length La of the first projecting portion 240b in the front-back direction approaches the length Lb, Lc of the first projecting portions 240a and 240b in the front-back direction. As a result, differences between the intervals between the regions in which the first signal conductor layer 22a and the first line-shaped reference conductor layer 24a overlap (overlapping regions) decrease. As a result, the capacitance between the first signal conductor layer 22a and the first line-shaped reference conductor layer 24a becomes more uniform over the entire region of the first signal conductor layer 22a. As a result, according to the circuit board 10a, variation in the characteristic impedance of the first signal conductor layer 22a from the desired characteristic impedance is reduced.

Second Modification

Figure 5:
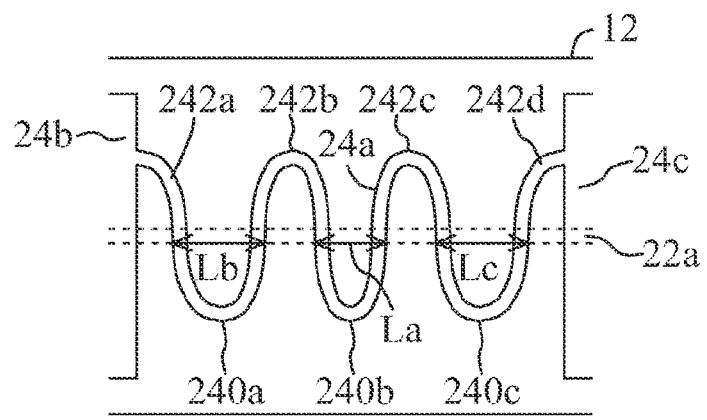
FIG. 5 is a top view of a central portion of a circuit board 10b in the front-back direction.
Figure 5:
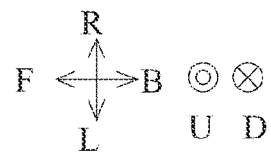
Figure 6:
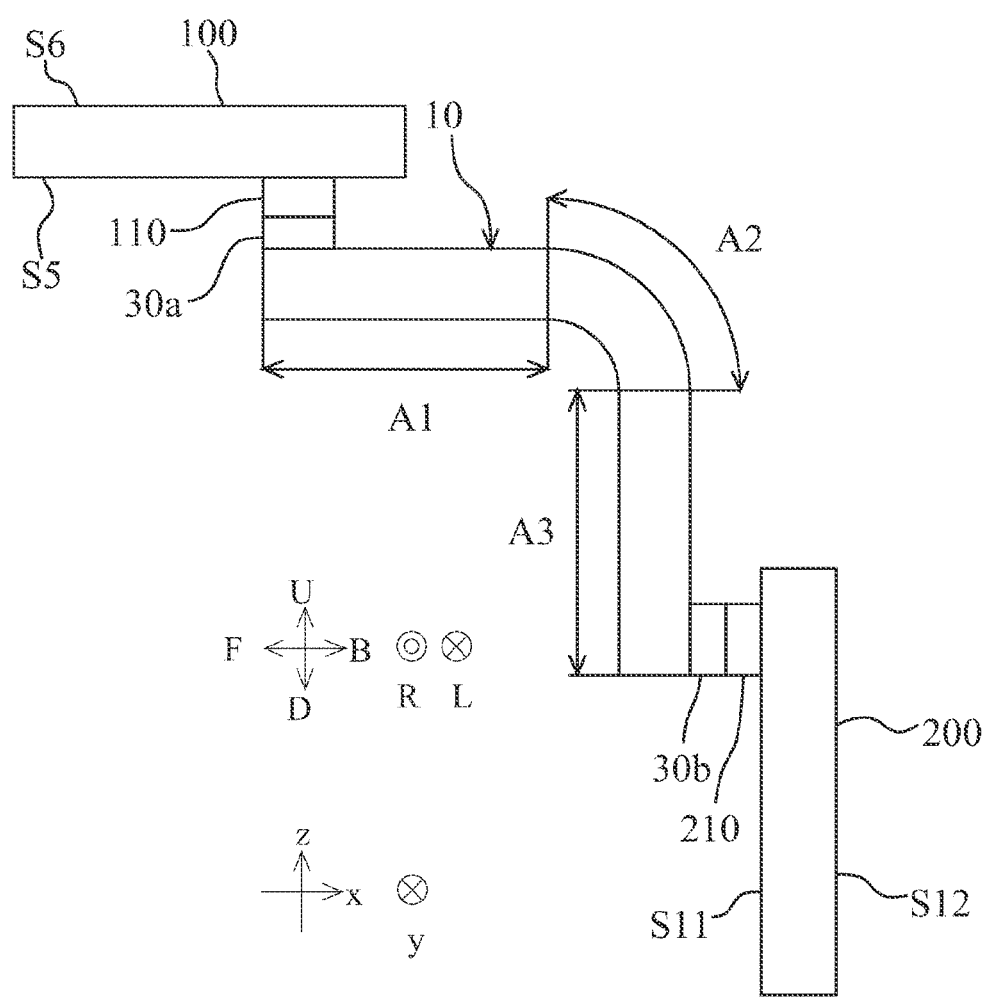
FIG. 6 is a left side view of a portion of the internal structure of an electronic device 1b including the circuit board 10b.

A circuit board 10b according to a second modification will now be described with reference to the drawings. FIG. 5 is a top view of a central portion of the circuit board 10b in the front-back direction. FIG. 6 is a left side view of a portion of the internal structure of an electronic device 1b including the circuit board 10b.

In the circuit board 10, the wavelength of the sine wave formed by the first line-shaped reference conductor layer 24a is constant. In the circuit board 10b, the wavelength of the sine wave formed by the first line-shaped reference conductor layer 24a is not constant. More specifically, the wavelength of the sine wave is shorter in the central region of the first line-shaped reference conductor layer 24a in the front-back direction than in regions near the front and rear ends of the first line-shaped reference conductor layer 24a in the front-back direction. Accordingly, the length La in the front-back direction (transmission direction) of the first projecting portion 240b closest to the center of the first signal conductor layer 22a in the front-back direction (transmission direction) is less than the length Lb, Lc in the front-back direction (transmission direction) of the first projecting portions 240a and 240c closest to the ends of the first signal conductor layer 22a in the front-back direction (transmission direction). The length Lb, Lc of the first projecting portions 240a and 240c in the front-back direction is the longest of the lengths of the first projecting portions 240a to 240c in the front-back direction. The length Lb, Lc of the first projecting portions 240a and 240c in the front-back direction is less than about ¼ of the wavelength of the high-frequency signal transmitted through the first signal conductor layer 22a, for example. In the above-described circuit board 10b, as illustrated in FIG. 6, the bent section A2 is bent in the negative z-axis direction (downward direction in the non-bent section) relative to the non-bent section A1. Other structures of the circuit board 10b are the same as those of the circuit board 10, and description thereof is thus omitted.

The circuit board 10b provides effects similar to those of the circuit board 10. In addition, according to the circuit board 10b, variation in the characteristic impedance of the first signal conductor layer 22a from the desired characteristic impedance is reduced. More specifically, in the circuit board 10b, as illustrated in FIG. 6, the bent section A2 is bent in the positive z-axis direction relative to the non-bent section A1. In this case, the central region of the first line-shaped reference conductor layer 24a in the front-back direction is expanded in the front-back direction to a greater extent than the regions near the front and rear ends of the first line-shaped reference conductor layer 24a. Accordingly, the length La in the front-back direction (transmission direction) of the first projecting portion 240b closest to the center of the first signal conductor layer 22a in the front-back direction (transmission direction) is less than the length Lb in the front-back direction (transmission direction) of the first projecting portions 240a and 240c closest to the ends of the first signal conductor layer 22a in the front-back direction (transmission direction). Accordingly, when the bent section A2 is bent in the positive z-axis direction relative to the non-bent section A1, the length La of the first projecting portion 240b in the front-back direction approaches the length Lb of the first projecting portions 240a and 240b in the front-back direction. As a result, differences between the intervals between the regions in which the first signal conductor layer 22a and the first line-shaped reference conductor layer 24a overlap decrease. As a result, the capacitance between the first signal conductor layer 22a and the first line-shaped reference conductor layer 24a becomes more uniform over the entire region of the first signal conductor layer 22a. As a result, according to the circuit board 10b, variation in the characteristic impedance of the first signal conductor layer 22a from the desired characteristic impedance is reduced.

Third Modification

Figure 7:
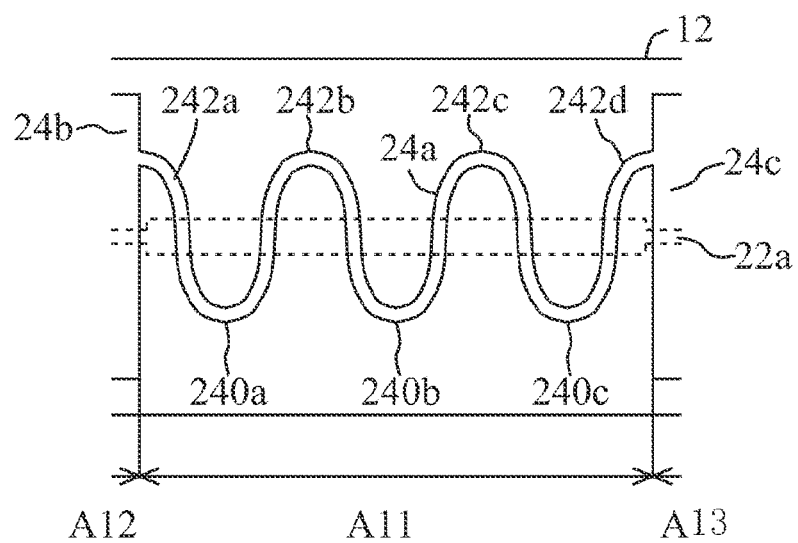
FIG. 7 is a top view of a central portion of a circuit board 10c in the front-back direction.

A circuit board 10c according to a third modification will now be described with reference to the drawings. FIG. 7 is a top view of a central portion of the circuit board 10c in the front-back direction.

The circuit board 10c differs from the circuit board 10 in the shape of the first signal conductor layer 22a. More specifically, a section in which the first signal conductor layer 22a and the first line-shaped reference conductor layer 24a extend next to each other is defined as a first section A11. A section in which the first signal conductor layer 22a and the first reference conductor layer 24b extend next to each other is defined as a second section A12. A section in which the first signal conductor layer 22a and the first reference conductor layer 24c extend next to each other is defined as a second section A13. The width of the first signal conductor layer 22a in the left-right direction (orthogonal direction) in the first section A11 is greater than the width of the first signal conductor layer 22a in the left-right direction (orthogonal direction) in the second sections A12 and A13. Other structures of the circuit board 10c are the same as those of the circuit board 10, and description thereof is thus omitted.

The circuit board 10c provides effects similar to those of the circuit board 10. In addition, according to the circuit board 10c, variation in the characteristic impedance of the first signal conductor layer 22a from the desired characteristic impedance is reduced. More specifically, an area in which a unit length of the first signal conductor layer 22a faces the first line-shaped reference conductor layer 24a in the first section A11 tends to be less than an area in which a unit length of the first signal conductor layer 22a faces the first reference conductor layers 24b and 24c in the second sections A12 and A13. Therefore, capacitance is not easily generated between a unit length of the first signal conductor layer 22a and the first line-shaped reference conductor layer 24a in the first section A11. Accordingly, the characteristic impedance of the first signal conductor layer 22a in the first section A11 tends to be greater than the characteristic impedance of the first signal conductor layer 22a in the second sections A12 and A13.

Accordingly, in the circuit board 10c, the width of the first signal conductor layer 22a in the left-right direction (orthogonal direction) in the first section A11 is greater than the width of the first signal conductor layer 22a in the left-right direction (orthogonal direction) in the second sections A12 and A13. Therefore, the area in which a unit length of the first signal conductor layer 22a faces the first line-shaped reference conductor layer 24a in the first section A11 approaches the area in which a unit length of the first signal conductor layer 22a faces each of the first reference conductor layers 24b and 24c in the second sections A12 and A13, respectively. As a result, the capacitance generated between a unit length of the first signal conductor layer 22a and the first line-shaped reference conductor layer 24a in the first section A11 approaches the capacitance generated between a unit length of the first signal conductor layer 22a and each of the first reference conductor layers 24b and 24c in the second sections A12 and A13, respectively. Therefore, the characteristic impedance of the first signal conductor layer 22a in the first section A11 approaches the characteristic impedance of the first signal conductor layer 22a in the second sections A12 and A13. As a result, according to the circuit board 10c, variation in the characteristic impedance of the first signal conductor layer 22a from the desired characteristic impedance is reduced.

Fourth Modification

Figure 8:
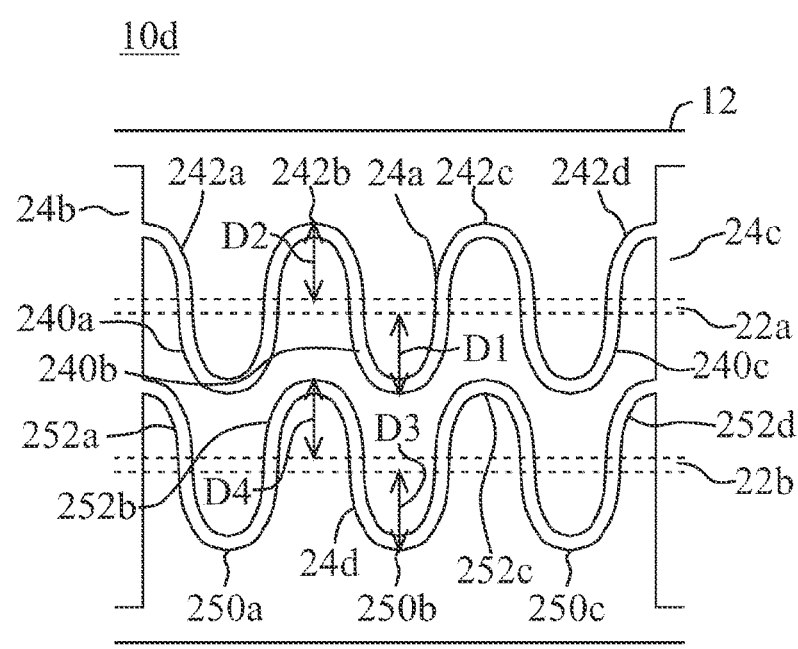
FIG. 8 is a top view of a central portion of a circuit board 10d in the front-back direction.
Figure 8:
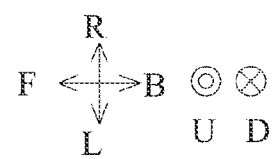

A circuit board 10d according to a fourth modification will now be described with reference to the drawings. FIG. 8 is a top view of a central portion of the circuit board 10d in the front-back direction.

The circuit board 10d differs from the circuit board 10 in that a second signal conductor layer 22b and a second line-shaped reference conductor layer 24d are additionally provided. The second signal conductor layer 22b and the second line-shaped reference conductor layer 24d have the same structures as those of the first signal conductor layer 22a and the first line-shaped reference conductor layer 24a, respectively. More specifically, the second signal conductor layer 22b is provided in the body 12. In the present preferred embodiment, the second signal conductor layer 22b is provided on the upper principal surface of the insulator layer 16b. The second signal conductor layer 22b is positioned to the left of the first signal conductor layer 22a. The second signal conductor layer 22b is line-shaped. Thus, the second signal conductor layer 22b extends next to the first signal conductor layer 22a.

The second line-shaped reference conductor layer 24d is provided in the body 12. In the present preferred embodiment, the second line-shaped reference conductor layer 24d is provided on the upper principal surface of the insulator layer 16a. The second line-shaped reference conductor layer 24d is positioned to the left of the first line-shaped reference conductor layer 24a. The second line-shaped reference conductor layer 24d is line-shaped.

When viewed in the up-down direction, the second line-shaped reference conductor layer 24d extends along the second signal conductor layer 22b such that portions of the second line-shaped reference conductor layer 24d overlap the second signal conductor layer 22b. When viewed in the up-down direction, the second line-shaped reference conductor layer 24d meanders such that third projecting portions 250a to 250c, which project leftward (in the first orthogonal direction) from the second signal conductor layer 22b, and fourth projecting portions 252a to 252d, which project rightward (in the second orthogonal direction) from the second signal conductor layer 22b, are arranged in an alternating order in the front-back direction (transmission direction).

The first line-shaped reference conductor layer 24a and the second line-shaped reference conductor layer 24d are in phase with each other. The first projecting portion 240a and the third projecting portion 250a are arranged next to each other in the left-right direction (orthogonal direction). The first projecting portion 240b and the third projecting portion 250b are arranged next to each other in the left-right direction (orthogonal direction). The first projecting portion 240c and the third projecting portion 250c are arranged next to each other in the left-right direction (orthogonal direction). The second projecting portion 242a and the fourth projecting portion 252a are arranged next to each other in the left-right direction (orthogonal direction). The second projecting portion 242b and the fourth projecting portion 252b are arranged next to each other in the left-right direction (orthogonal direction). The second projecting portion 242c and the fourth projecting portion 252c are arranged next to each other in the left-right direction (orthogonal direction). The second projecting portion 242d and the fourth projecting portion 252d are arranged next to each other in the left-right direction (orthogonal direction).

The second line-shaped reference conductor layer 24d is not connected to another conductor layer over a length corresponding to the wavelength of the sine wave formed by the second line-shaped reference conductor layer 24d. More specifically, assume that a pair including one of the third projecting portions and one of the fourth projecting portions that are adjacent to each other is defined as a second pair of projecting portions. In this case, at least one or more second pairs of projecting portions of the second line-shaped reference conductor layer 24d are not connected to another conductor layer. Other structures of the circuit board 10d are the same as those of the circuit board 10, and description thereof is thus omitted.

The circuit board 10d provides effects similar to those of the circuit board 10. In addition, according to the circuit board 10d, when the bent section A2 is bent, the occurrence of stress concentration in the first line-shaped reference conductor layer 24a and the second line-shaped reference conductor layer 24d is reduced. More specifically, when the first line-shaped reference conductor layer 24a and the second line-shaped reference conductor layer 24d are too close to each other in a certain region, the circuit board stiffens in this region. Therefore, when the bent section A2 is bent, stress concentration easily occurs in the first line-shaped reference conductor layer 24a and the second line-shaped reference conductor layer 24d in this region.

Accordingly, the first projecting portion 240a and the third projecting portion 250a are arranged next to each other in the left-right direction (orthogonal direction). The first projecting portion 240b and the third projecting portion 250b are arranged next to each other in the left-right direction (orthogonal direction). The first projecting portion 240c and the third projecting portion 250c are arranged next to each other in the left-right direction (orthogonal direction). The second projecting portion 242a and the fourth projecting portion 252a are arranged next to each other in the left-right direction (orthogonal direction). The second projecting portion 242b and the fourth projecting portion 252b are arranged next to each other in the left-right direction (orthogonal direction). The second projecting portion 242c and the fourth projecting portion 252c are arranged next to each other in the left-right direction (orthogonal direction). The second projecting portion 242d and the fourth projecting portion 252d are arranged next to each other in the left-right direction (orthogonal direction). Thus, the first line-shaped reference conductor layer 24a and the second line-shaped reference conductor layer 24d are in phase with each other. Therefore, the distance between the first line-shaped reference conductor layer 24a and the second line-shaped reference conductor layer 24d does not significantly vary over the entire length of the first line-shaped reference conductor layer 24a and the entire length of the second line-shaped reference conductor layer 24d. Accordingly, a region in which the first line-shaped reference conductor layer 24a and the second line-shaped reference conductor layer 24d are too close to each other is not easily generated. As a result, according to the circuit board 10d, stress concentration that occurs in the first line-shaped reference conductor layer 24a and the second line-shaped reference conductor layer 24d when the bent section A2 is bent is reduced.

Fifth Modification

Figure 9:
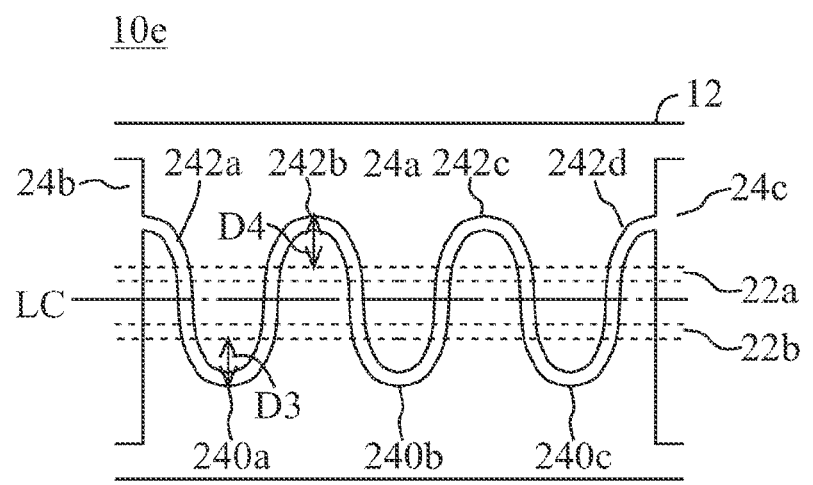
FIG. 9 is a top view of a central portion of a circuit board 10e in the front-back direction.
Figure 9:
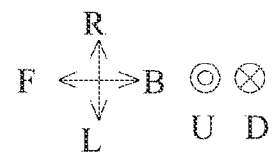

A circuit board 10e according to a fifth modification will now be described with reference to the drawings. FIG. 9 is a top view of a central portion of the circuit board 10e in the front-back direction.

The circuit board 10e differs from the circuit board 10 in that a second signal conductor layer 22b is additionally provided. The first signal conductor layer 22a and the second signal conductor layer 22b define a differential transmission line. In other words, a high-frequency signal transmitted through the first signal conductor layer 22a and a high-frequency signal transmitted through the second signal conductor layer 22b are in antiphase with each other. More specifically, the second signal conductor layer 22b is provided in the body 12. In the present preferred embodiment, the second signal conductor layer 22b is provided on the upper principal surface of the insulator layer 16b. The second signal conductor layer 22b is positioned to the left of (in the first orthogonal direction from) the first signal conductor layer 22a. The second signal conductor layer 22b is line-shaped. The second signal conductor layer 22b extends next to the first signal conductor layer 22a at a position to the left of (in the first orthogonal direction from) the first signal conductor layer 22a.

When viewed in the up-down direction, the first signal conductor layer 22a is positioned slightly to the right of the center LC of the first line-shaped reference conductor layer 24a in the left-right direction. When viewed in the up-down direction, the second signal conductor layer 22b is positioned slightly to the left of the center LC of the first line-shaped reference conductor layer 24a in the left-right direction. The first signal conductor layer 22a and the second signal conductor layer 22b are line-symmetrical to each other about the center LC. Portions of the first signal conductor layer 22a and portions of the second signal conductor layer 22b overlap portions of the first line-shaped reference conductor layer 24a when viewed in the up-down direction. Therefore, the first projecting portions 240a to 240c project leftward (in the first orthogonal direction) from the second signal conductor layer 22b. The second projecting portions 242a to 242d project rightward (in the second orthogonal direction) from the first signal conductor layer 22a. An amount of projection D3 of the first projecting portions 240a to 240c from the second signal conductor layer 22b in the leftward direction (first orthogonal direction) is substantially equal to an amount of projection D4 of the second projecting portions 242a to 242d from the first signal conductor layer 22a in the rightward direction (second orthogonal direction).

The above-described circuit board 10e provides effects similar to those of the circuit board 10. In addition, according to the circuit board 10e, loss in the high-frequency signal transmitted through the first signal conductor layer 22a and the high-frequency signal transmitted through the second signal conductor layer 22b can be reduced. More specifically, the first signal conductor layer 22a and the second signal conductor layer 22b form a differential transmission line. Accordingly, the direction of a current that flows through the first signal conductor layer 22a and the direction of a current that flows through the second signal conductor layer 22b are opposite to each other. In this case, in sections of the first line-shaped reference conductor layer 24a positioned between the first signal conductor layer 22a and the second signal conductor layer 22b when viewed in the up-down direction, a current generated by electromagnetic induction from the current flowing through the first signal conductor layer 22a and a current generated by electromagnetic induction from the current flowing through the second signal conductor layer 22b cancel each other. In other words, substantially no current flows through the sections of the first line-shaped reference conductor layer 24a positioned between the first signal conductor layer 22a and the second signal conductor layer 22b. Therefore, resonance does not easily occur in the first line-shaped reference conductor layer 24a. When resonance does not easily occur in the first line-shaped reference conductor layer 24a, standing waves are not easily generated in the first line-shaped reference conductor layer 24a. As a result, radiation from the first line-shaped reference conductor layer 24a does not easily occur. Thus, the high-frequency signal transmitted through the first signal conductor layer 22a and the high-frequency signal transmitted through the second signal conductor layer 22b are not easily used for radiation. According to the circuit board 10e, loss in the high-frequency signal transmitted through the first signal conductor layer 22a and the high-frequency signal transmitted through the second signal conductor layer 22b is reduced.

According to the circuit board 10e, the characteristic impedance of the first signal conductor layer 22a and the characteristic impedance of the second signal conductor layer 22b do not easily vary from the desired characteristic impedance (for example, about 100Ω) due to displacements between the layers of the body 12. More specifically, the amount of projection D3 of the first projecting portions 240a to 240c from the second signal conductor layer 22b in the left-right direction is substantially equal to the amount of projection D4 of the second projecting portions 242a to 242d from the first signal conductor layer 22a in the left-right direction. Therefore, when viewed in the up-down direction, the first signal conductor layer 22a and the second signal conductor layer 22b overlap portions of the first line-shaped reference conductor layer 24a near the center in the left-right direction. Accordingly, when viewed in the up-down direction, the first signal conductor layer 22a and the second signal conductor layer 22b do not easily protrude from the first line-shaped reference conductor layer 24a in the left-right direction even if the layers of the body 12 are displaced from each other. As a result, the capacitance between the first signal conductor layer 22a and the first line-shaped reference conductor layer 24a does not easily vary from the design value. The capacitance between the second signal conductor layer 22b and the first line-shaped reference conductor layer 24a does not easily vary from the design value. Thus, according to the circuit board 10e, the characteristic impedance of the first signal conductor layer 22a and the characteristic impedance of the second signal conductor layer 22b do not easily vary from the desired characteristic impedance (for example, about 100Ω) due to displacements between the layers of the body 12.

Sixth Modification

Figure 10:
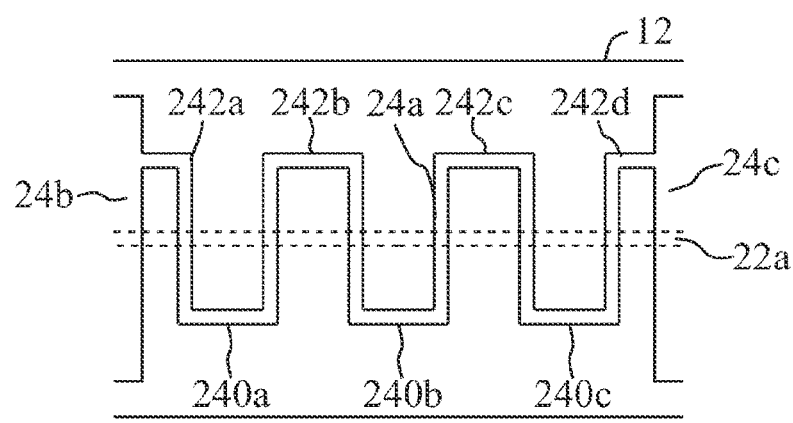
FIG. 10 is a top view of a central portion of a circuit board 10f in the front-back direction.
Figure 10:
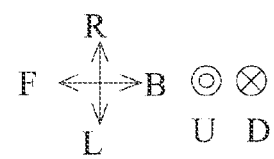

A circuit board 10f according to a sixth modification will now be described with reference to the drawings. FIG. 10 is a top view of a central portion of the circuit board 10f in the front-back direction.

The circuit board 10f differs from the circuit board 10 in that the first line-shaped reference conductor layer 24a has the shape of a rectangular wave. In other words, the first line-shaped reference conductor layer 24a has a structure obtained by combining a plurality of straight-line-shaped conductor layers extending in the front-back direction and a plurality of straight-line-shaped conductor layers extending in the left-right direction. Other structures of the circuit board 10f are the same as those of the circuit board 10, and description thereof is thus omitted. The circuit board 10f provides effects similar to those of the circuit board 10. In addition, the first line-shaped reference conductor layer 24a includes line-shaped conductor layers extending in the left-right direction. Therefore, even when the first signal conductor layer 22a is displaced in the left-right direction due to displacements between the layers of the body 12, the areas of regions in which the first signal conductor layer 22a and the first line-shaped reference conductor layer 24a overlap do not easily vary. As a result, the characteristic impedance of the first signal conductor layer 22a does not easily vary from the desired characteristic impedance due to displacements between the layers of the body 12.

Seventh Modification

Figure 11:
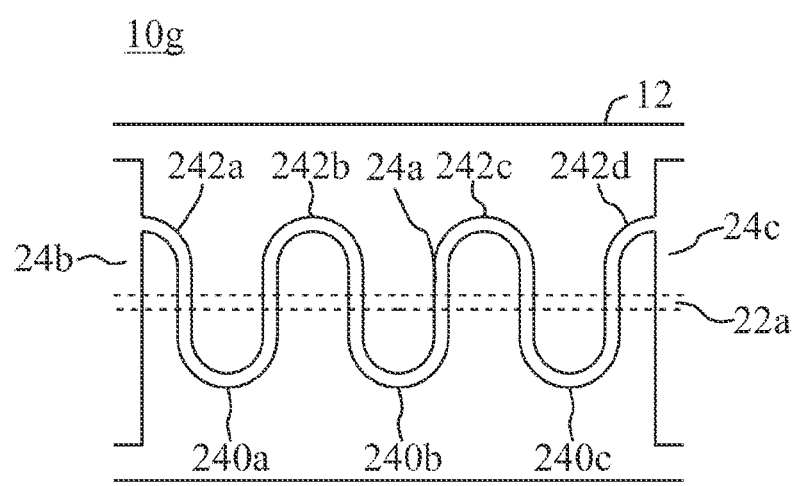
FIG. 11 is a top view of a central portion of a circuit board 10g in the front-back direction.

A circuit board 10g according to a seventh modification will now be described with reference to the drawings. FIG. 11 is a top view of a central portion of the circuit board 10g in the front-back direction.

The circuit board 10g differs from the circuit board 10f in that the first line-shaped reference conductor layer 24a has a structure obtained by combining a plurality of straight-line-shaped conductor layers and a plurality of semicircular-line-shaped conductor layers. In other words, the first line-shaped reference conductor layer 24a of the circuit board 10g has a shape obtained by rounding the corners of the first line-shaped reference conductor layer 24a of the circuit board 10f. The circuit board 10g provides effects similar to those of the circuit board 10f. In addition, according to the circuit board 10g, the first line-shaped reference conductor layer 24a does not have corners. Therefore, stress concentration does not easily occur in the first line-shaped reference conductor layer 24a. As a result, the possibility of breakage of the first line-shaped reference conductor layer 24a is reduced.

Eighth Modification

Figure 12:
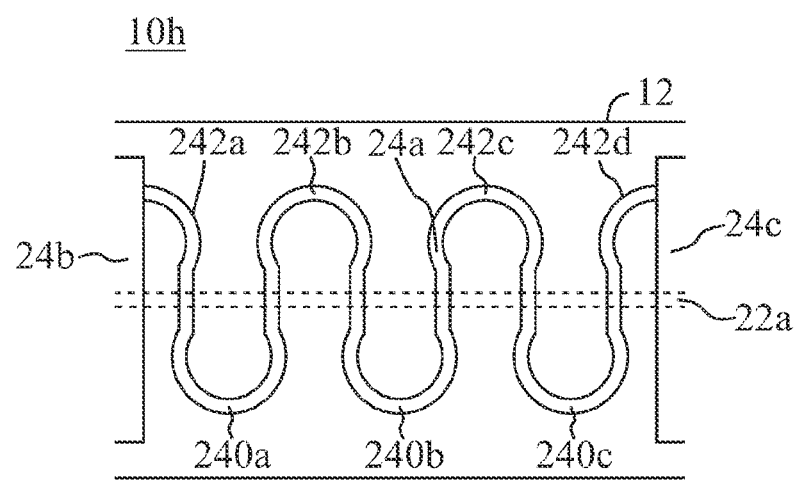
FIG. 12 is a top view of a central portion of a circuit board 10h in the front-back direction.
Figure 12:
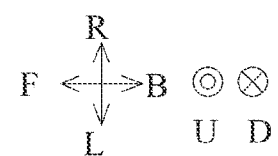

A circuit board 10h according to an eighth modification will now be described with reference to the drawings. FIG. 12 is a top view of a central portion of the circuit board 10h in the front-back direction.

The circuit board 10h differs from the circuit board 10g in that the first line-shaped reference conductor layer 24a has a structure obtained by combining a plurality of straight-line-shaped conductor layers and a plurality of arc-line-shaped conductor layers. The arc-line-shaped conductor layers have a central angle of about 180° or more, for example. The circuit board 10h provides effects similar to those of the circuit board 10g. In addition, according to the circuit board 10h, the first line-shaped reference conductor layer 24a includes arc-line-shaped conductor layers having a central angle of about 180° or more, for example. Therefore, the radius of the arc-line-shaped conductor layers is large. As a result, stress concentration does not easily occur in the first line-shaped reference conductor layer 24a. As a result, the possibility of breakage of the first line-shaped reference conductor layer 24a is reduced.

Ninth Modification

Figure 13:
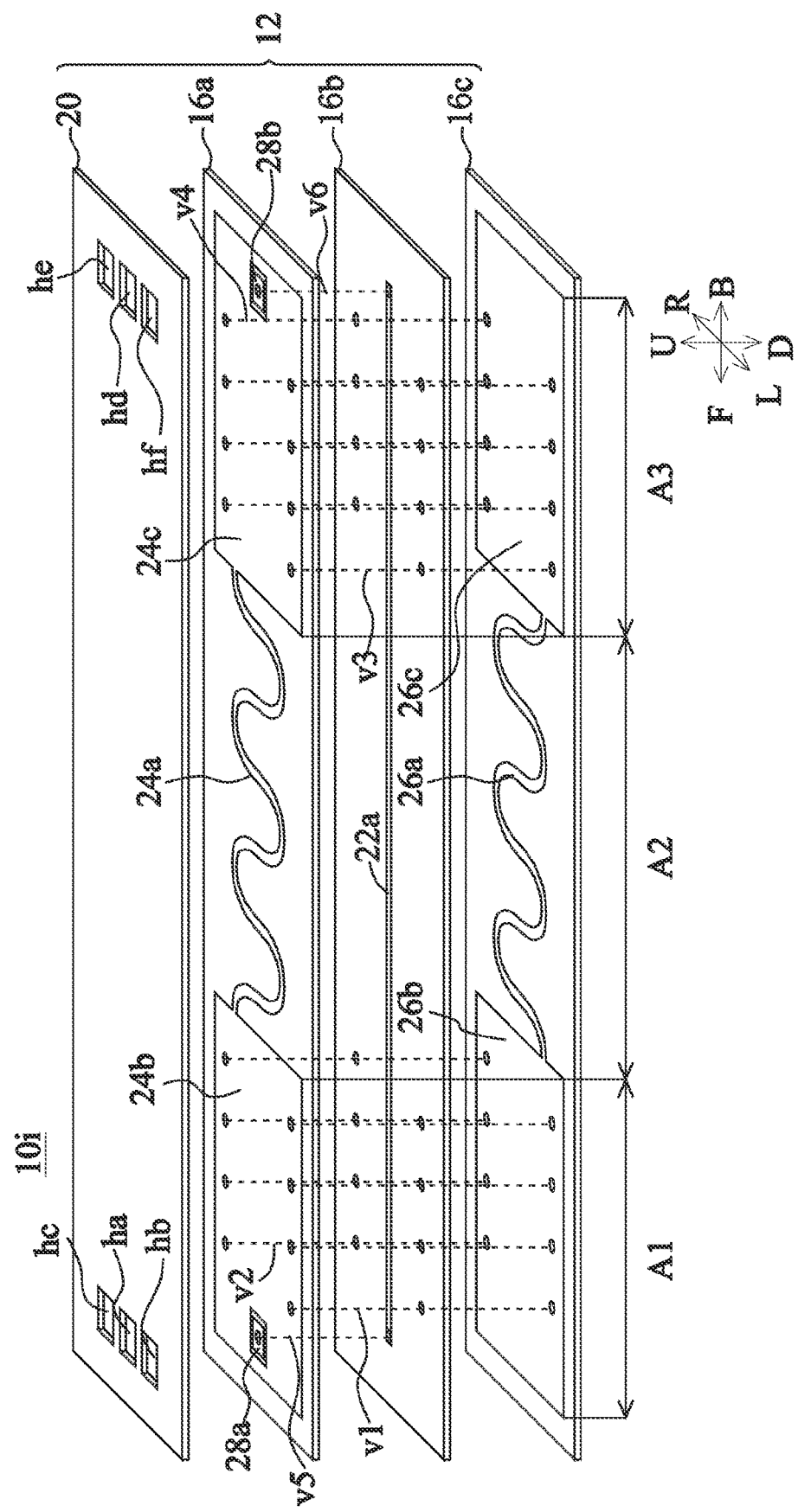
FIG. 13 is an exploded perspective view of a circuit board 10i.

A circuit board 10i according to a ninth modification will now be described with reference to the drawings. FIG. 13 is an exploded perspective view of the circuit board 10i.

The circuit board 10i differs from the circuit board 10 in that a third line-shaped reference conductor layer 26a is additionally provided. The third line-shaped reference conductor layer 26a has a shape symmetrical to that of the first line-shaped reference conductor layer 24a in the left-right direction. Since the third line-shaped reference conductor layer 26a is provided in place of the second reference conductor layer 26, the circuit board 10i can be more easily bent.

Although the third line-shaped reference conductor layer 26a has a shape symmetrical to that of the first line-shaped reference conductor layer 24a in the left-right direction, the shape of the third line-shaped reference conductor layer 26a may be the same as that of the first line-shaped reference conductor layer 24a. In the case where the third line-shaped reference conductor layer 26a has a shape symmetrical to that of the first line-shaped reference conductor layer 24a in the left-right direction, the entirety of the first line-shaped reference conductor layer 24a and the entirety of the third line-shaped reference conductor layer 26a do not overlap when viewed in the up-down direction. Therefore, the circuit board 10i can be more easily bent.

The third line-shaped reference conductor layer 26a may be disposed on a lower principal surface of the insulator layer 16c. In such a case, the lower principal surface of the insulator layer 16c may be covered with a protective layer.

Other Preferred Embodiments

The circuit boards according to preferred embodiments of the present invention are not limited to the circuit boards 10 and 10a to 10i, and various changes are possible within the gist of the present invention. The structures of the circuit boards 10 and 10a to 10i may be combined as appropriate.

In the circuit boards 10 and 10a to 10h, the first reference conductor layers 24b and 24c and the second reference conductor layer 26 are not essential. When the circuit boards 10 and 10a to 10h include no second reference conductor layer 26, the circuit boards 10 and 10a to 10h have a micro-strip-line structure.

In the circuit boards 10 and 10a to 10i, the protective layer 20 is not essential.

In the circuit boards 10 and 10a to 10i, the entirety of the first line-shaped reference conductor layer 24a is disposed in the bent section A2. However, the first line-shaped reference conductor layer 24a may be disposed such that at least a portion thereof is in the bent section A2.

The circuit boards 10 and 10a to 10h may include a third line-shaped reference conductor layer having the same shape as the first line-shaped reference conductor layer 24a in place of the second reference conductor layer 26. In this case, the phase of the third line-shaped reference conductor layer may be shifted from the phase of the first line-shaped reference conductor layer 24a by about ½ of the wavelength of the sine wave formed by the first line-shaped reference conductor layer 24a, for example. Alternatively, the third line-shaped reference conductor layer and the first line-shaped reference conductor layer 24a may be in phase with each other.

In the circuit boards 10 and 10a to 10i, the length of the first projecting portions 240a to 240c in the front-back direction and the length of the second projecting portions 242b and 242c in the front-back direction may be greater than about ¼ of the wavelength of the high-frequency signal transmitted through the first signal conductor layer 22a, for example.

In the circuit boards 10, 10a to 10d, and 10f to 10i, it is not necessary that the amount of projection D1 of the first projecting portions 240a to 240c from the first signal conductor layer 22a in the left-right direction be substantially equal to the amount of projection D2 of the second projecting portions 242a to 242d from the first signal conductor layer 22a in the left-right direction.

In the circuit board 10d, it is not necessary that the first line-shaped reference conductor layer 24a and the second line-shaped reference conductor layer 24d be in phase with each other.

In the circuit board 10d, the wavelength of the sine wave formed by the first line-shaped reference conductor layer 24a may differ from the wavelength of the sine wave formed by the second line-shaped reference conductor layer 24d.

In the circuit board 10e, it is not necessary that the amount of projection D3 of the first projecting portions 240a to 240c from the second signal conductor layer 22b in the leftward direction be substantially equal to the amount of projection D4 of the second projecting portions 242a to 242d from the first signal conductor layer 22a in the rightward direction.

In the circuit boards 10 and 10a to 10i, it is not necessary that the material of the insulator layers 16a to 16c contain a thermoplastic resin.

The circuit boards 10 and 10a to 10i extend in the front-back direction when viewed in the up-down direction. However, the circuit boards 10 and 10a to 10i may be bent. Here, "circuit boards 10 and 10a to 10i are bent" means that the circuit boards 10 and 10a to 10i have a bent shape when no external force is applied.

In the circuit boards 10 and 10a to 10i, the first line-shaped reference conductor layer 24a, the first reference conductor layers 24b and 24c, and the second reference conductor layer 26 may be connected to a reference potential other than the ground potential. The reference potential is a potential that serves as a reference in an electronic device.

Similarly to the circuit board 10e, the circuit boards 10, 10a to 10d, and 10f to 10i may additionally include the second signal conductor layer 22b.

Similarly to the circuit board 10d, the circuit boards 10, 10a to 10c, and 10e to 10i may additionally include the second signal conductor layer 22b and the second line-shaped reference conductor layer 24d.

Similarly to the circuit board 10c, in the circuit boards 10, 10a, 10b, and 10d to 10i, the width of the first signal conductor layer 22a in the left-right direction (orthogonal direction) in the first section A11 may be greater than the width of the first signal conductor layer 22a in the left-right direction (orthogonal direction) in the second sections A12 and A13. In the circuit boards 10d and 10e, the width of the second signal conductor layer 22b in the left-right direction (orthogonal direction) in the first section A11 may be greater than the width of the second signal conductor layer 22b in the left-right direction (orthogonal direction) in the second sections A12 and A13.

In the circuit boards 10 and 10c to 10i, similarly to the circuit boards 10a and 10b, the wavelength of the wave formed by the first line-shaped reference conductor layer 24a may be non-constant. In the circuit board 10d, similarly to the circuit boards 10a and 10b, the wavelength of the wave formed by the second line-shaped reference conductor layer 24d may be non-constant.

In the circuit boards 10 and 10c to 10i, the first reference conductor layers 24b and 24c and the second reference conductor layer 26 may have a mesh structure.

In the circuit boards 10 and 10a to 10i, the interlayer connection conductors v1 to v6 may be through-hole conductors. The through-hole conductors are formed by forming through holes in the insulator layers 16a to 16c and plating the inner peripheral surfaces of the through holes.

The first line-shaped reference conductor layer 24a and the second line-shaped reference conductor layer 24b in the circuit boards 10 and 10a to 10e may have the same shape as the first signal conductor layer 22a in the circuit boards 10f to 10i or a shape in which the shapes of the first signal conductor layers 22a in the circuit board 10f to 10i are combined.

In the circuit boards 10 and 10a to 10i, it is not necessary that the body 12 have a multilayer structure. In other words, the body 12 may include a single insulator layer.

In the circuit boards 10 and 10a to 10i, the first line-shaped reference conductor layer 24a may include at least one first projecting portion and at least one second projecting portion.

In the circuit boards 10 and 10a to 10i, the non-bent sections A1 and A3 may be slightly bent. In such a case, the radii of curvature of the non-bent sections A1 and A3 are greater than the radius of curvature of the bent section A2.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A circuit board comprising:
 a body including an upper principal surface and a lower principal surface, the upper principal surface having a normal extending in an up-down direction;
 a first signal conductor layer that is line-shaped and provided in the body; and
 a first line-shaped reference conductor layer that is line-shaped and provided in the body at a position above the first signal conductor layer; wherein
 an insulator layer is provided between the first signal conductor layer and the first line-shaped reference conductor layer in the up-down direction;
 a direction in which the first signal conductor layer extends is defined as a transmission direction;
 a direction orthogonal to the up-down direction and the transmission direction is defined as an orthogonal direction;
 the orthogonal direction includes a first orthogonal direction and a second orthogonal direction opposite to the first orthogonal direction;
 when viewed in the up-down direction, the first line-shaped reference conductor layer extends along the first signal conductor layer such that portions of the first line-shaped reference conductor layer and portions of the first signal conductor layer overlap;

when viewed in the up-down direction, the first line-shaped reference conductor layer meanders such that one or more first projecting portions projecting from the first signal conductor layer in the first orthogonal direction and one or more second projecting portions projecting from the first signal conductor layer in the second orthogonal direction are arranged in an alternating order in the transmission direction;

a pair including one of the one or more first projecting portions and one of the one or more second projecting portions that are adjacent to each other is defined as a first pair of projecting portions; and a section of at least one or more first pairs of projecting portions excluding both ends of the at least one or more first pairs of projecting portions is not connected to a conductor layer other than one or more of the one or more first projecting portions and one or more of the one or more second projecting portions included in the at least one or more first pairs of projecting portions.

2. The circuit board according to claim 1, wherein
the circuit board includes a bent section and a non-bent section;
at least a portion of the first line-shaped reference conductor layer is in the bent section;
the circuit board has a flat shape in the non-bent section; and
the bent section is bent in the up-down direction in the non-bent section relative to the non-bent section.

3. The circuit board according to claim 2, wherein an entirety of the first line-shaped reference conductor layer is in the bent section.

4. The circuit board according to claim 1, wherein a length of the one or more first projecting portions in the transmission direction and a length of the one or more second projecting portions in the transmission direction is less than or equal to about ¼ of a wavelength of a high-frequency signal transmitted through the first signal conductor layer.

5. The circuit board according to claim 1, wherein an amount of projection of the one or more first projecting portions from the first signal conductor layer in the orthogonal direction is equal to an amount of projection of the one or more second projecting portions from the first signal conductor layer in the orthogonal direction.

6. The circuit board according to claim 1, further comprising:
a second line-shaped reference conductor layer that is line-shaped and provided in the body; and
a second signal conductor layer that is line-shaped and provided in the body; wherein
the second signal conductor layer extends next to the first signal conductor layer;
when viewed in the up-down direction, the second line-shaped reference conductor layer extends along the second signal conductor layer such that portions of the second line-shaped reference conductor layer overlap the second signal conductor layer;
when viewed in the up-down direction, the second line-shaped reference conductor layer meanders such that one or more third projecting portions projecting from the second signal conductor layer in the first orthogonal direction and one or more fourth projecting portions projecting from the second signal conductor layer in the second orthogonal direction are arranged in an alternating order in the transmission direction;

a pair including one of the one or more third projecting portions and one of the one or more fourth projecting portions that are adjacent to each other is defined as a second pair of projecting portions;

at least one or more second pairs of projecting portions of the second line-shaped reference conductor layer are not connected to another conductor layer;

the one or more first projecting portions are arranged next to the one or more third projecting portions in the orthogonal direction; and the one or more second projecting portions are arranged next to the one or more fourth projecting portions in the orthogonal direction.

7. The circuit board according to claim 6, wherein the first reference conductor layer and the second reference conductor layer have a mesh structure.

8. The circuit board according to claim 1, further comprising:
a second signal conductor layer that is line-shaped and provided in the body;
the second signal conductor layer is spaced in the first orthogonal direction from the first signal conductor layer;
the second signal conductor layer extends next to the first signal conductor layer at a position in the first orthogonal direction from the first signal conductor layer;
the one or more first projecting portions project from the second signal conductor layer in the first orthogonal direction; and
the one or more second projecting portions project from the first signal conductor layer in the second orthogonal direction.

9. The circuit board according to claim 8, wherein the first signal conductor layer and the second signal conductor layer define a differential transmission line.

10. The circuit board according to claim 8, wherein an amount of projection of the one or more first projecting portions from the second signal conductor layer in the first orthogonal direction is equal to an amount of projection of the one or more second projecting portions from the first signal conductor layer in the second orthogonal direction.

11. The circuit board according to claim 1, further comprising:
a first reference conductor layer provided in the body at a position above the first signal conductor layer, the first reference conductor layer being connected to an end of the first line-shaped reference conductor layer and overlapping the first signal conductor layer when viewed in the up-down direction; wherein
a width of the first reference conductor layer in the orthogonal direction is greater than or equal to a width of the first line-shaped reference conductor layer in the orthogonal direction.

12. The circuit board according to claim 11, wherein
a section in which the first signal conductor layer and the first line-shaped reference conductor layer extend next to each other is defined as a first section;
a section in which the first signal conductor layer and the first reference conductor layer extend next to each other is defined as a second section; and
a width of the first signal conductor layer in the orthogonal direction in the first section is greater than a width of the first signal conductor layer in the orthogonal direction in the second section.

13. The circuit board according to claim 1, wherein
the first line-shaped reference conductor layer includes a plurality of the first projecting portions; and a length, in the transmission direction, of one of the first projecting portions closest to a center of the first line-shaped reference conductor layer in the transmission direction is less than a length, in the transmission direction, of one of the first projecting portions closest to an end of the first line-shaped reference conductor layer in the transmission direction.

14. The circuit board according to claim 13, wherein
the circuit board includes a bent section and a non-bent section;
at least a portion of the first line-shaped reference conductor layer is in the bent section;
the circuit board has a flat shape in the non-bent section; and
the bent section is bent in a downward direction in the non-bent section relative to the non-bent section.

15. The circuit board according to claim 1, wherein
the first signal conductor layer includes a plurality of the first projecting portions; and
a length, in the transmission direction, of one of the first projecting portions closest to a center of the first signal conductor layer in the transmission direction is greater than a length, in the transmission direction, of one of the first projecting portions closest to an end of the first signal conductor layer in the transmission direction.

16. The circuit board according to claim 15, wherein
the circuit board includes a bent section and a non-bent section;
at least a portion of the first line-shaped reference conductor layer is in the bent section;
the circuit board has a flat shape in the non-bent section; and
the bent section is bent in an upward direction in the non-bent section relative to the non-bent section.

17. The circuit board according to claim 1, wherein a material of the body includes a thermoplastic resin.

18. The circuit board according to claim 1, wherein the circuit board has a micro-strip-line structure.

19. The circuit board according to claim 1, wherein the circuit board has a permanently bent shape.

20. The circuit board according to claim 1, further comprising interlayer connection conductors defined by through-hole conductors extending through the body.

* * * * *